United States Patent
Davies et al.

(10) Patent No.: US 9,059,660 B1
(45) Date of Patent: Jun. 16, 2015

(54) VARIABLE FREQUENCY OSCILLATOR WITH SPECIALIZED INVERTER STAGES

(71) Applicant: International Business Machines Corporation, Armonk, NY (US)

(72) Inventors: Andrew D. Davies, Rochester, MN (US); Joel T. Ficke, Bloomer, WI (US); David M. Friend, Rochester, MN (US); Grant P. Kesselring, Rochester, MN (US); James D. Strom, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/109,364

(22) Filed: Dec. 17, 2013

(51) Int. Cl.
*H03B 5/02* (2006.01)
*H03B 5/12* (2006.01)

(52) U.S. Cl.
CPC ........................... *H03B 5/124* (2013.01)

(58) Field of Classification Search
USPC .................. 331/36 C, 57, 143, 175, 177 R
See application file for complete search history.

(56) References Cited

U.S. PATENT DOCUMENTS

| | | | |
|---|---|---|---|
| 3,671,881 A | 6/1972 | Yorganjian | |
| 4,799,028 A | 1/1989 | Weaver et al. | |
| 4,920,322 A | 4/1990 | Ruijs | |
| 5,764,111 A | 6/1998 | Bushman | |
| 6,339,349 B1 | 1/2002 | Rajagopalan | |
| 6,504,436 B2 | 1/2003 | Horikawa et al. | |
| 6,556,094 B2 | 4/2003 | Hasegawa et al. | |
| 7,102,450 B2 | 9/2006 | Forbes | |
| 8,134,419 B2 | 3/2012 | Nakano et al. | |
| 8,248,172 B2 | 8/2012 | Okada et al. | |
| 2002/0113657 A1* | 8/2002 | Dufour | 331/57 |
| 2003/0214361 A1* | 11/2003 | Nishikido | 331/57 |
| 2005/0168293 A1* | 8/2005 | Kato et al. | 331/36 C |
| 2008/0036512 A1* | 2/2008 | Yamamoto et al. | 327/155 |
| 2012/0187987 A1 | 7/2012 | Ficke et al. | |
| 2013/0147564 A1* | 6/2013 | Wang | 331/57 |
| 2014/0022023 A1* | 1/2014 | Huang | 331/57 |

OTHER PUBLICATIONS

Crabbe et al., "High-Low Polysilicon-Emitter SiGe-Base Bipolar Transistors," IEEE Electron Device Letters, Oct. 1993, pp. 478-480, vol. 14, Issue 10, IEEE Electron Devices Society, © 1993 IEEE. D.O.I. 10.1109/55.244736.
Gierkink et al., "A Coupled Sawtooth Oscillator Combining Low Jitter With High Control Linearity," IEEE Journal of Solid-State Circuits, Jun. 2002, pp. 702-710, vol. 37, Issue 6, IEEE Solid-State Circuits Society, © 2002 IEEE. D.O.I. 10.1109/JSSC.2002.1004574.

(Continued)

*Primary Examiner* — Joseph Chang
*Assistant Examiner* — Jeffrey Shin
(74) *Attorney, Agent, or Firm* — Robert R. Williams

(57) ABSTRACT

A variable frequency oscillator device includes a first inverter stage that is designed to invert an input signal to generate a sawtooth signal by charging and discharging a capacitor using current sources that each provides a respective amount of current that is responsive to a control signal and to a dampening signal. A second inverter stage is designed to generate a first inverted signal from the sawtooth signal of the first inverter stage. A third inverter stage is designed to generate a second inverted signal from the first inverted signal, and dampen a signal transition rate for the first inverted signal based upon the control signal.

12 Claims, 4 Drawing Sheets

(56) References Cited

OTHER PUBLICATIONS

Lee et al., "A Scalable Sub-1.2mW 300MHz-to-1.5GHz Host-Clock PLL for System-on-Chip in 32nm CMOS," IEEE International Solid-State Circuits Conference Digest of Technical Papers (ISSCC), Feb. 2011, pp. 96-97, San Francisco, CA, © 2011 IEEE. D.O.I. 10.1109/ISSCC.2011.5746235.

Morkoc, "MODFETs Soar to 400 GHz," IEEE Circuits and Devices Magazine, Nov. 1991, pp. 14-20, vol. 7, Issue 6, IEEE Circuits and Systems Society, © 1991 IEEE. D.O.I. 10.1109/101.101751.

Toso et al., "An Integrated Divide-by-Two Direct Injection-Locking Frequency Divider for Bands S Through $K_{u}$," IEEE Transactions on Microwave Theory and Techniques, Jul. 2010, pp. 1686-1695, vol. 58, Issue 7, IEEE Microwave Theory and Techniques Society, © 2010 IEEE. D.O.I. 10.1109/TMTT.2010.2049680.

* cited by examiner

VARIABLE FREQUENCY OSCILLATOR WITH SPECIALIZED INVERTER STAGES

BACKGROUND

This disclosure relates to variable frequency oscillators (VFOs). In particular, it relates to VFOs with specialized inverter stages.

Variable frequency oscillator (VFO) circuits include both voltage control oscillator (VCO) circuits and current controlled oscillator (ICO) circuits and can produce an oscillating signal whose frequency and phase can be adjusted in response to an input voltage or current, respectively. These types of circuits can be used to generate oscillating signals in phase-locked loops (PLLs), timing recovery circuits and modulation circuits.

SUMMARY

Embodiments are directed toward a variable frequency oscillator device that includes a first inverter stage. The first inverter stage has at least one capacitor having a parasitic capacitance and designed to alternating current (AC) couple the first inverter stage to an output node; a push pull circuit configured to generate a sawtooth signal for capacitive coupling to the output node by: inverting an input signal, and charging and discharging, responsive to a control signal, an oscillator capacitance predominantly derived from the parasitic capacitance of the at least one capacitor. A second inverter stage can be designed to generate a first inverted signal from the output node of the first inverter stage. A third inverter stage can be designed to generate a second inverted signal from the first inverted signal and to provide the second inverted signal as the input signal.

According to embodiments, a variable frequency oscillator device includes a first inverter stage that is designed to invert an input signal to generate a sawtooth signal by charging and discharging a capacitor using current sources that each provides a respective amount of current that is responsive to a control signal and to a dampening signal. A second inverter stage is designed to generate a first inverted signal from the sawtooth signal of the first inverter stage. A third inverter stage is designed to generate a second inverted signal from the first inverted signal, and dampen a signal transition rate for the first inverted signal based upon the control signal.

Embodiments are directed toward a method in which a first inverter stage is used to generate a sawtooth signal by inverting an input signal, and charging and discharging, responsive to a control signal, an oscillator capacitance predominantly derived from a parasitic capacitance of at least one capacitor. The sawtooth signal is capacitively coupled, using the at least one capacitor, to an output node. A second inverter stage is used to generate a first inverted signal from the output node. A third inverter stage is used to generate a second inverted signal from the first inverted signal. The second inverted signal is provided as the input signal.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments of the invention and do not limit the disclosure.

Figure 1:
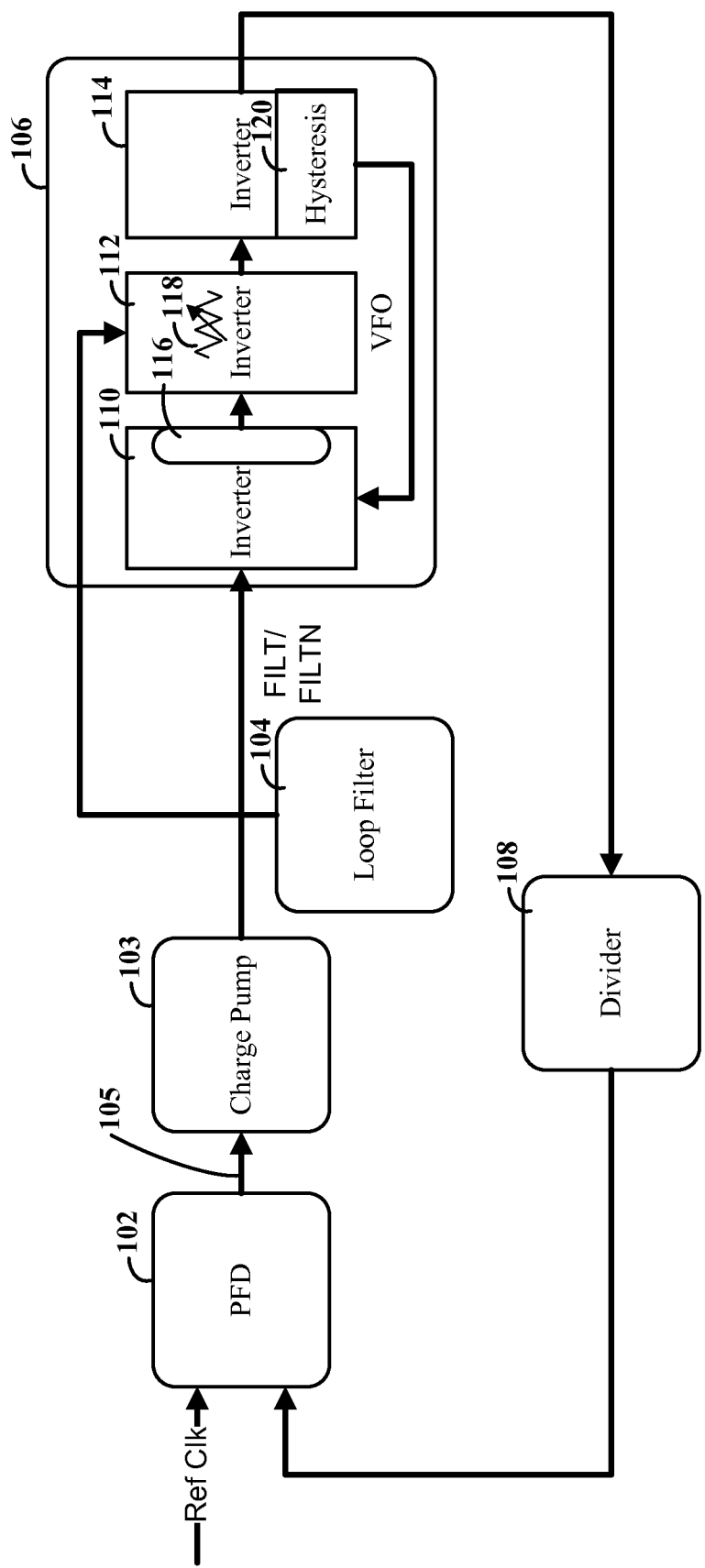
FIG. 1 depicts a block diagram of a PLL system with a VFO, consistent with embodiments of the present disclosure.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

Aspects of the present disclosure relate to the generation of oscillating signals, more particular aspects relate to variable frequency oscillator (VFO) with inverter stages tailored for use at gigahertz frequencies and for multiple ranges of frequencies (e.g., 20-30 GHz). While the present invention is not necessarily limited to such applications, various aspects of the invention may be appreciated through a discussion of various examples using this context.

Embodiments of the present disclosure relate to VFOs that are configured to use the parasitic capacitance of a capacitive coupling capacitor to provide the primary (or predominate) capacitance for a capacitive oscillation circuit. For instance, an oscillator circuit can be configured to add and remove charge from a capacitance in order to produce a sawtooth signal. A capacitive (AC) coupling capacitor can provide isolation from subsequent (inverter) stages of the VFO, which can further process the sawtooth signal. The capacitive coupling capacitor can be designed with a parasitic capacitance value that allows for it to be used as the primary (or predominate) capacitance used in the generation the sawtooth signal.

Certain embodiments relate to VFOs that are configured to produce oscillating signals within a relatively large frequency range depending upon a control signal (voltage or current signal). Particular embodiments include a hysteresis feedback component that can be designed to dampen (slow) the internal oscillator signal transition rate based upon the control signal. For instance, the VFO can be configured to increase dampening (slowing the signal transition rate) for lower frequency settings of the VFO.

Various embodiments are directed toward a VFO that is configured to modify a resistor feedback component of an inverter stage based upon the control signal. These and other aspects and embodiments can be used in various combinations depending upon the particular application and desired outcome. For instance, particular embodiments are directed toward a VFO that is configured to provide low jitter at multi gigahertz frequencies, e.g., jitter sufficient to support input/output busses running at 16 GHz and optic busses running at 25.78125 GHz. Embodiments also are directed toward a VFO that is configured to provide a relatively wide frequency of operation (e.g., from 3 GHz to 40 GHz).

Low jitter can be used in various applications in order to achieve a high dynamic range. In some applications, such as VFOs used in frequency (de)modulation circuits, control linearity can be important to help reduce distortion of a (de) modulated signal and for a favorable loop transfer function of the PLL. For instance, particular embodiments are directed toward a VFO designed to be used in connection with specifications that have relatively stringent requirements including, but not necessarily limited to: serial advanced technology attachment (SATA), peripheral component interconnect (PCI), double data rate (DDR) and SERDES (Pico Semiconductors).

Turning now to the figures, FIG. 1 depicts a block diagram of a PLL system with a VFO, consistent with embodiments of the present disclosure. Phase-frequency detector (PFD) 102 can be configured to compare a reference clock to a feedback signal from the PLL system. The output 105 of the PFD represents a mismatch between these two signals and can be provided to a charge pump 103. The charge pump can generate a control signal (e.g., FILT, FILTN) and a loop filter circuit 104 can provide signal conditioning. For instance, the loop filter circuit 104 can be configured to control how the system responds to changes in various parameters, such as changes to the reference clock (frequency, phase, etc.) and changes to the feedback divider settings. The loop filter circuit 104 can also be configured to limiting the amount of reference frequency energy (ripple) appearing at the phase detector output. A few possible implementations of a loop filter circuit include, but are not necessarily limited to, a low pass filter circuit and a notch filter circuit.

The output (e.g., FILT and FILTN) of the loop filter circuit 104 can be provided to the VFO (circuit) 106. VFO 106 can be configured to generate a signal that oscillates at a frequency that is controlled by the output of the loop filter circuit. In some embodiments, a frequency divider circuit 108 can divide the frequency of the VFO output signal and provide the resulting signal as a feedback to the PFD 102. For instance, if the frequency divider circuit 108 is a 3:1 divider, then the PLL system will converge on a VFO output frequency that is three times that of the reference clock.

Various embodiments of the present disclosure are directed toward a VFO that includes multiple inverter stages 110, 112, 114. Embodiments are directed toward the inverter stages having one or more of the features discussed herein and in various combinations of these features. For instance, inverter stage 110 can include a capacitive coupling capacitor 116 that provides isolation between inverter stages 110 and 112. In certain embodiments, the capacitive coupling capacitor can be configured to have a parasitic capacitance to a supply voltage rail, e.g., ground (GA) or supply (VRA), which is sufficient to be used as the primary capacitance of an inverter circuit that generates a sawtooth signal having a frequency that is responsive to a control signal. For instance, the oscillator circuits can be configured to charge and discharge the capacitance using current sources and a push-pull configuration of transistors. The amount of current for charging and discharging can be controlled by the control signal, which can be received from the loop filter circuit. The use of parasitic capacitance can be particularly useful for integrated circuit (IC) savings in cost, real estate or both (e.g., by not using, or reducing the size of, an additional capacitor).

In some instances, the second inverter stage 112 can be configured to use a feedback loop that includes a variable resistive component 118. The resistive value for the variable resistive component can be adjusted based upon the value of the control signal input, and thus, be adjusted according to the steady state frequency of the VFO for the particular control signal input value. This can be particularly useful for adjusting the inverter stage's operating characteristics or parameters according to the desired frequency of operation for the VFO and for providing a large frequency range for the VFO.

Various embodiments are directed toward the third inverter stage 114 being configured to provide hysteresis control over the internal oscillation signal within the VFO. A hysteresis control circuit 120 can be configured to dampen or slow the signal transitions for the internal oscillation signal of the VFO, including reducing overshoot or undershoot. For instance, the feedback can adjust the effective internal drive strength of the VFO based upon the control signal input (FILT, FILTN). In certain embodiments, the effective internal drive strength of the VFO is lower for slower frequencies (and corresponding values of the control signal) than for higher frequencies. This can be particularly useful for adjusting the operating characteristics or parameters for the VFO based upon the desired frequency of the VFO and for providing a large frequency range for the VFO.

Figure 2:
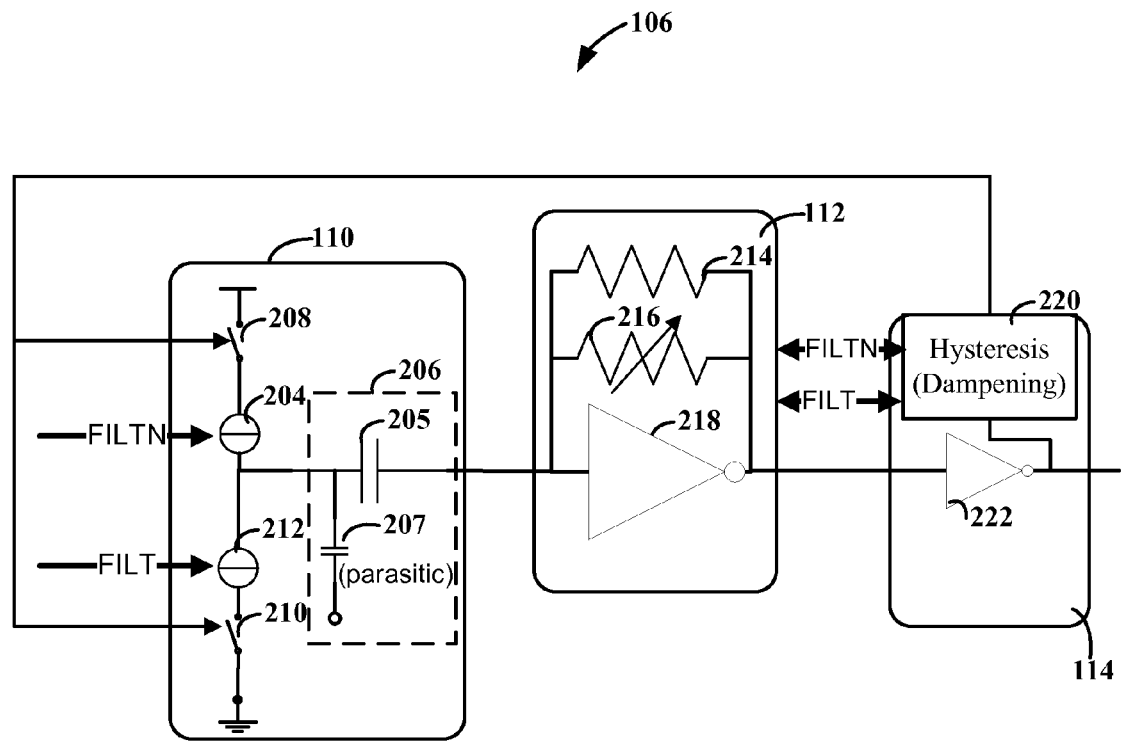
FIG. 2 depicts a block diagram for a VFO that includes multiple inverter stages, consistent with embodiments of the present disclosure.

FIG. 2 depicts a block diagram for a VFO that includes multiple inverter stages, consistent with embodiments of the present disclosure. The VFO 106, as shown in FIG. 2, can be consistent with one or more embodiments discussed herein and as depicted in various figures. In certain embodiments, VFO 106 can be configured to oscillate using feedback based upon an internal oscillation signal passing through multiple inverter stages. The first inverter stage 110 can be configured to invert an input signal (fed back from the last inverter stage 114) using a push-pull configuration of transistors 208, 210. The transistors 208, 210 can be configured to charge and discharge a capacitance to produce a saw tooth output signal. Control signals (FILT, FILTN) can control how quickly the capacitance is charged/discharged by controlling the amount of current provided by drive strength control components 204, 212. In certain embodiments, drive strength components 204, 212 can control the current using one or more transistors that are configured to limit current based upon the control signals.

Various embodiments are directed toward the use of capacitor 206 to provide isolation between the first inverter stage 110 and the second inverter stage 112. For instance, the capacitor 206 can be configured to provide capacitive coupling 205 between the stages. The output node of the first inverter stage can therefore be isolated from the transistors 208, 210. The capacitor 206 can also be designed with a parasitic capacitance 207 that is sufficiently large to serve as the primary (predominate or only) capacitance used in the production of the saw tooth output signal. In some embodiments, a smaller, additional capacitor (not shown) can be used in parallel with the parasitic capacitance.

According to embodiments, the second inverter stage 112 can be configured to invert the output of the first inverter stage 110 using an inverting circuit 218. In certain instances, the second inverter can include a feedback path that includes resistive components 214, 216. This feedback component can include a variable resistive component 216, which can be designed to adjust based upon the control input signal. In particular, the resistive component 216 can be configured to reduce the resistance of the feedback path for higher settings of the control input signal and for corresponding higher oscillation frequencies. In certain embodiments, the feedback path can include other resistive components 214, which can be in parallel, series (or both) to the variable resistive component 216. For instance, transistor elements that are used as resistors and may have various limitations on their resistive capabilities. A desired effective resistance can be obtained through combinations of such transistor elements whether in series or in parallel.

Consistent with embodiments of the present disclosure, the third inverter stage 114 can be configured to invert the output of the second inverter stage 112 using inverter circuit 222. The resulting signal can then be provided as feedback to the first inverter stage 110. In some embodiments, the third inverter can be designed to include a hysteresis circuit 220. Hysteresis circuit 220 can be configured to adjust the drive strength of one or more of the inverter stages based upon the control input signal. In particular, the signal transition rate for the internal oscillation signal can be dampened for lower control input signal settings and corresponding lower oscillation frequencies. For instance, the hysteresis circuit 220 can provide a dampening effect on the internal oscillation signal as it is provided to the third inverter stage. The dampening effect can thereby adjust the overall characteristics of the VFO.

Figure 3:
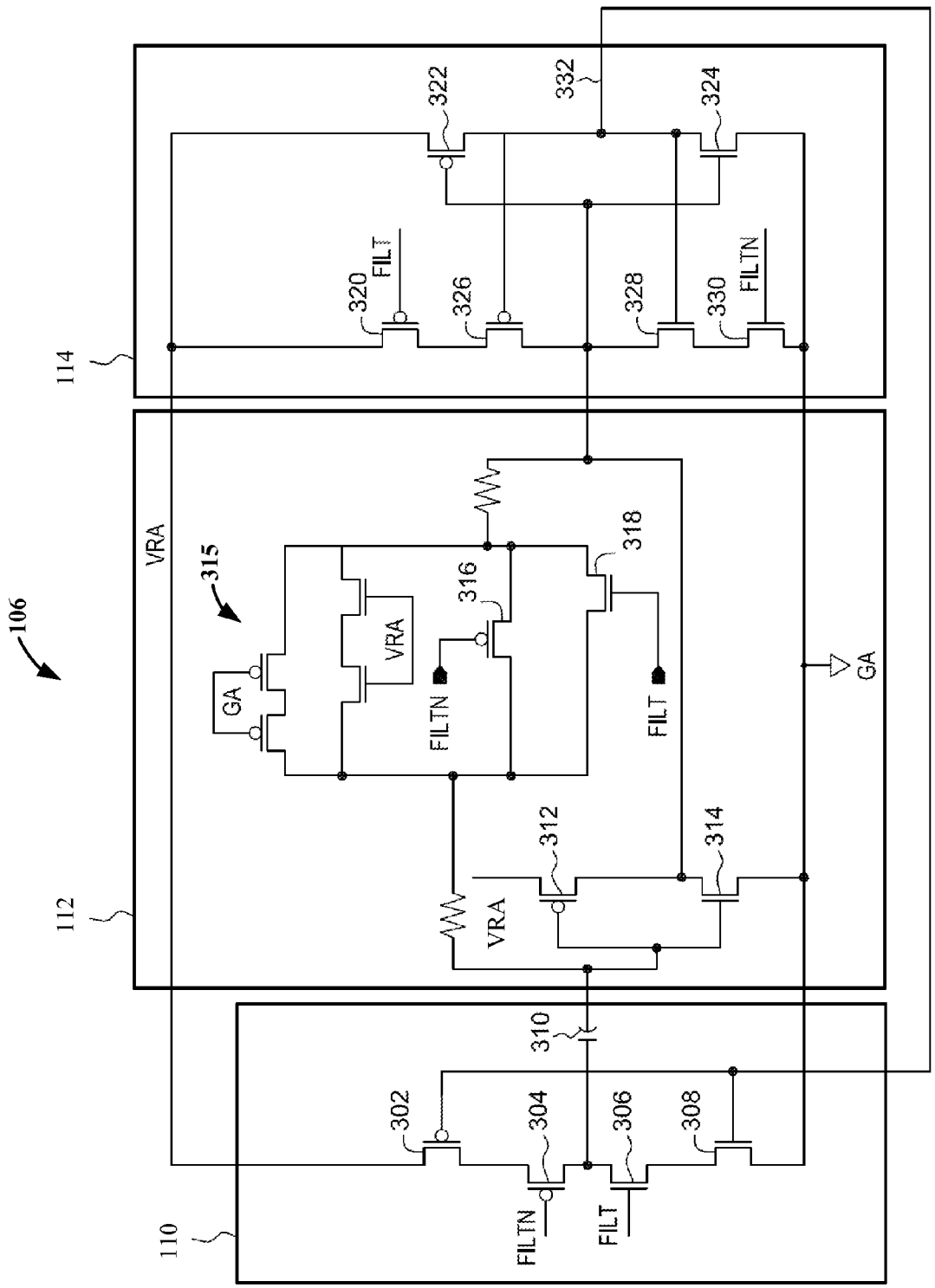
FIG. 3 depicts a circuit diagram for a VCO, consistent with embodiments of the present disclosure.

FIG. 3 depicts a circuit diagram for a VCO, consistent with embodiments of the present disclosure. VCO 106 can be consistent with one or more embodiments of VFO discussed herein and in connection with various other figures. A first inverter stage 110 can be formed from the transistors 302, 308, which can be configured to invert the feedback signal 328. Transistors 302 and 308 can be connected to a voltage source (VRA) and ground (GA), respectively.

Transistors 304, 306 provide control over the drive strength of the inverter stage by adjusting current provided to capacitor 310 based upon the values of the input control signals (FILT, FILTN). In various embodiments, capacitor 310 can be designed with parasitic capacitance (not shown) that is sufficient to create a sawtooth oscillating signal within the frequency range of the VCO. For instance, parasitic capacitance can increase with the size of the capacitor. Accordingly, capacitor 310 can be designed to be sufficiently large so as to provide more than half (or all) of the capacitance used to create the sawtooth oscillating signal. In some embodiments, capacitor 310 can have a value of around 25 fF or within a range of 5 fF to 300 fF. Various embodiments allow for capacitive values outside of such a range, depending upon the particular application (e.g., desired oscillation frequencies, circuit design parameters and other considerations). In some embodiments, the capacitor 310 can be constructed from more than one capacitor arranged in parallel and thereby function as a single capacitance for the capacitive coupling.

The second inverter stage 112 can include transistors 312 and 314, which can be configured to invert the output of the first inverter stage (provided using capacitive coupling through capacitor 310). In some embodiments, the second inverter stage can include a feedback path having a resistance that is adjustable based upon the control input signal. For instance, transistors 316, 318 can be configured to adjust the resistance of the feedback path in response to the control input signal (FILT, FILTN), which can be tied to the gates of the transistors. This can result in feedback that is adjustable based upon the desired frequency of oscillation, as may be useful for facilitating a wide frequency of operation for the VCO. Consistent with various embodiments, the feedback path can include other resistive elements such as dedicated resistors and one or more transistors 315.

The third inverter stage 114 can include transistors 322, 324, which can be configured to invert the output of the second inverter stage and provide the inverted signal 332 as an input to the first inverter stage. Various embodiments include the use of a hysteresis providing circuit that includes transistors 320, 326, 328, 330. The hysteresis circuit can be configured to counteract, or dampen, the signal transition rate for the third inverter stage. In particular, transistors 320, 326, 328, 330 can be configured to produce a dampening signal that has a dampening strength responsive to the input control signal (FILT, FILTN), which can be tied to the gates of transistors 320, 330. In addition to modifying the signal transition rate, the amplitude of the signal from the first stage can also be increased, for low frequencies of oscillation, because the transistors 312, 314 do not turn on as early due to the feedback from the hysteresis circuit. This can result in inverter characteristics that are adjustable based upon the desired frequency of oscillation, as may be useful for a wide frequency of operation for the VCO.

Figure 4:
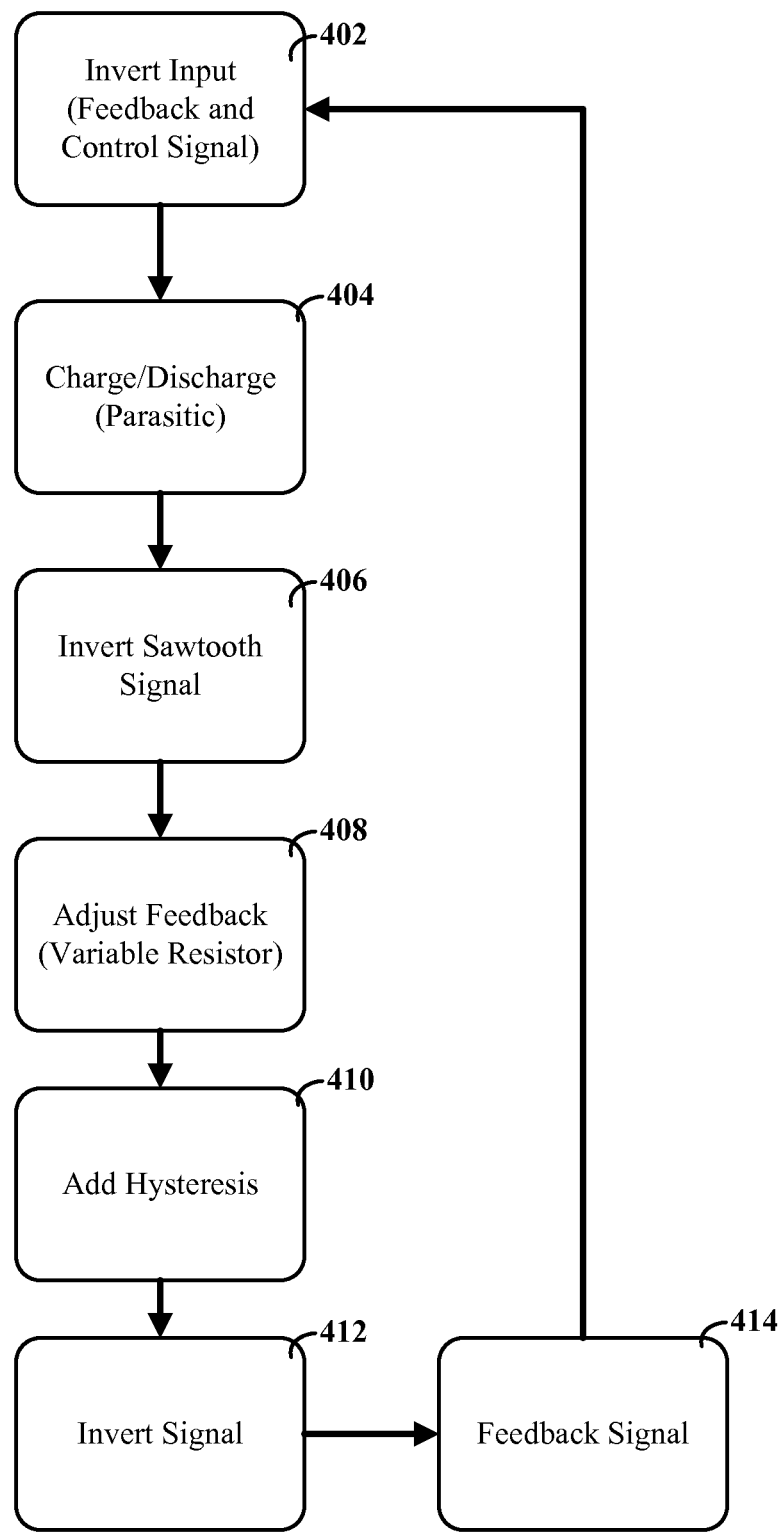
FIG. 4 depicts a flow diagram for generating an oscillating signal, consistent with embodiments of the present disclosure.

FIG. 4 depicts a flow diagram for generating an oscillating signal, consistent with embodiments of the present disclosure. The input to the first inverter stage can be inverted according to block 402. The input can include feedback of the internal oscillation signal from the VFO and a control signal input (e.g., originating from a PFD and charge pump). In certain embodiments, this inversion can include the charging and discharging of an oscillation capacitance using a push-pull transistor configuration, per block 404. Various embodiments are directed toward the oscillation capacitance being predominantly, or completely, provided from the parasitic capacitance of a capacitor also used to capacitive couple the first inverter stage to a second inverter stage. In certain embodiments, the resulting signal is a sawtooth signal that oscillates at a frequency that is responsive to the control signal input.

The second inverter stage can then be used to invert the sawtooth signal to provide an internal oscillation signal as an output, per block 406. Embodiments of the present disclosure are directed toward the use of a resistive feedback path in the second inverter stage. As discussed herein, the resistive feedback path can include a variable resistive component that can be adjusted in response to the control signal input, per block 408.

According to embodiments, a third inverter stage can be used to introduce hysteresis to the internal oscillation circuit by counteracting, or dampening, the internal oscillation signal, per block 410. The amount of the dampening can be adjusted in response to the control signal input. The third inverter stage can then be used to invert the internal oscillation signal, per block 412. This inverted signal can then be provided as feedback (input) to the first inverter stage, per block 414.

As used herein, like numbers can be used to signify components that have similar or the same functions and that may be used in similar or the same embodiments; however, the signified components are not necessarily limited to embodiments discussed or depicted in any one figure.

Various embodiments of the present disclosure can be implemented as part of an integrated chip. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Although the present disclosure has been described in terms of specific embodiments, it is anticipated that alterations and modifications thereof will become apparent to those skilled in the art. Therefore, it is intended that the following claims be interpreted as covering all such alterations and modifications as fall within the true spirit and scope of the disclosure.

What is claimed is:

1. A variable frequency oscillator device comprising:
a first inverter stage having:
at least one capacitor having a parasitic capacitance to alternating current (AC) couple the first inverter stage to an output node;
a push pull circuit configured to generate a sawtooth signal for capacitive coupling to the output node by:
inverting an input signal, and
charging and discharging, responsive to a control signal, an oscillator capacitance predominantly derived from the parasitic capacitance of the at least one capacitor;
a second inverter stage to generate a first inverted signal from the output node of the first inverter stage, the second inverter stage including a resistive feedback path to, in response to changes in the control signal, change resistance values; and
a third inverter stage designed to generate a second inverted signal from the first inverted signal and to provide the second inverted signal as the input signal.

2. The device of claim 1, wherein the third inverter stage is designed to dampen a signal transition rate of the second inverted signal in response to the control signal.

3. The device of claim 1, wherein the third inverter stage includes two transistors designed to dampen a signal transition rate for the first inverted signal based upon the control signal.

4. The device of claim 3, wherein the two transistors have gates tied to the control signal and wherein the third inverter stage further includes two additional transistors having gates tied to an output of the third inverter stage.

5. A variable frequency oscillator device comprising:
a first inverter stage designed to invert an input signal to generate a sawtooth signal by charging and discharging a capacitor using current sources that each provide a respective amount of current that is responsive to a control signal and to a dampening signal;
a second inverter stage designed to generate a first inverted signal from the sawtooth signal of the first inverter stage; and
a third inverter stage designed to:
generate a second inverted signal from the first inverted signal, and
dampen a signal transition rate for the first inverted signal based upon the control signal.

6. The device of claim 5, wherein the third inverter stage includes two transistors having gates tied to the control signal.

7. The device of claim 6, wherein the third inverter stage further includes two additional transistors having gates tied to an output of the third inverter stage.

8. The device of claim 5, wherein the capacitor is configured to:
provide capacitive coupling between the first and second inverted stages; and
provide an oscillator capacitance predominantly derived from a parasitic capacitance of the capacitor.

9. The device of claim 5, wherein the second inverter stage includes a resistive feedback path.

10. The device of claim 5, wherein the second inverter stage includes a resistive feedback path that is designed to change resistance values in response to changes in the control signal.

11. A method comprising:
generating, using a first inverter stage, a sawtooth signal by:
inverting an input signal, and
charging and discharging, responsive to a control signal, an oscillator capacitance predominantly derived from a parasitic capacitance of at least one capacitor;
capacitively coupling, using the at least one capacitor, the sawtooth signal to an output node;
generating, using a second inverter stage, a first inverted signal from the output node;
generating, using a third inverter stage, a second inverted signal from the first inverted signal;
providing the second inverted signal as the input signal; and
dampening, in response to the control signal, a signal transition rate for the third inverter stage.

12. The method of claim 11, further comprising adjusting a resistance of a resistive feedback path for the second inverter stage in response to the control signal.

* * * * *